United States Patent
Ahn et al.

(10) Patent No.: US 12,082,431 B2
(45) Date of Patent: Sep. 3, 2024

(54) DISPLAY DEVICE

(71) Applicant: Samsung Display Co., LTD., Yongin-si (KR)

(72) Inventors: Jea Heon Ahn, Hwaseong-si (KR); Jang Soo Kim, Asan-si (KR); Jeong Ki Kim, Hwaseong-si (KR); Jae Cheol Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 517 days.

(21) Appl. No.: 17/392,739

(22) Filed: Aug. 3, 2021

(65) Prior Publication Data

US 2022/0115612 A1 Apr. 14, 2022

(30) Foreign Application Priority Data

Oct. 12, 2020 (KR) .................. 10-2020-0131067

(51) Int. Cl.
   *H10K 50/115* (2023.01)
   *H10K 59/121* (2023.01)
   (Continued)

(52) U.S. Cl.
   CPC ......... *H10K 50/115* (2023.02); *H10K 59/121* (2023.02); *H10K 59/122* (2023.02); *H10K 59/353* (2023.02); *H10K 59/38* (2023.02)

(58) Field of Classification Search
   CPC .. H10K 50/115; H10K 59/121; H10K 59/122; H10K 59/353; H10K 59/38;
   (Continued)

(56) References Cited

U.S. PATENT DOCUMENTS

| 7,920,231 B2 * | 4/2011 | Tanno | G02F 1/134363 |
| | | | 349/88 |
| 2002/0070909 A1 * | 6/2002 | Asano | H10K 59/35 |
| | | | 345/76 |

(Continued)

FOREIGN PATENT DOCUMENTS

| KR | 10-2015-0012542 | 2/2015 |
| KR | 10-2015-0064469 | 6/2015 |

(Continued)

*Primary Examiner* — Earl N Taylor
(74) *Attorney, Agent, or Firm* — KILE PARK REED & HOUTTEMAN PLLC

(57) ABSTRACT

A display device includes a pixel; and a first color conversion region, a second color conversion region, and a third color conversion region respectively overlapping a first color pixel, a second color pixel, and a third color pixel and spaced from each other. The third color conversion region is aligned with a region between the first color conversion region and the second color conversion region in a first direction, and the first color conversion region and the second color conversion region are aligned with each other in a second direction crossing the first direction. Part of the first color conversion region is disposed in a second pixel area that is adjacent to the first pixel area in the second direction, and part of the second color conversion region is positioned in a third pixel area that is adjacent to the first pixel area in the second direction.

20 Claims, 11 Drawing Sheets

(51) Int. Cl.
*H10K 59/122* (2023.01)
*H10K 59/35* (2023.01)
*H10K 59/38* (2023.01)

(58) Field of Classification Search
CPC ............ H10K 2102/331; H01L 27/322; H01L 27/3218; H01L 27/3246; H01L 27/326
See application file for complete search history.

(56) References Cited

U.S. PATENT DOCUMENTS

| | | | | |
|---|---|---|---|---|
| 2011/0084290 | A1* | 4/2011 | Nakamura | H10K 50/8426 257/89 |
| 2017/0207281 | A1* | 7/2017 | Hack | H10K 50/852 |
| 2018/0158882 | A1* | 6/2018 | Kim | H10K 59/38 |
| 2018/0188593 | A1* | 7/2018 | Kim | G02F 1/133514 |
| 2019/0212610 | A1* | 7/2019 | Kim | H10K 59/8792 |
| 2020/0227485 | A1* | 7/2020 | Park | H10K 50/858 |
| 2021/0335893 | A1* | 10/2021 | Baek | H10K 59/12 |
| 2023/0135697 | A1* | 5/2023 | Lee | H10K 59/38 257/91 |

FOREIGN PATENT DOCUMENTS

| | | |
|---|---|---|
| KR | 10-2018-0061853 | 6/2018 |
| KR | 10-1934088 | 1/2019 |
| KR | 10-2019-0085133 | 7/2019 |

* cited by examiner

DISPLAY DEVICE

CROSS-REFERENCE TO RELATED APPLICATION

This application claims priority to and the benefit of Korean Patent Application No. 10-2020-0131067 under § 119, filed in the Korean Intellectual Property Office (KIPO) on Oct. 12, 2020, the entire contents of which are incorporated herein by reference.

BACKGROUND

1. Technical Field

This disclosure relates to a display device and a manufacturing method thereof.

2. Description of Related Art

Display devices such as an emissive display device or a liquid crystal display are used as image displaying devices. Recently, display devices for improving display characteristics such as color purity, color reproducibility, or a contrast ratio by use of quantum dots are developed.

The above information disclosed in this Background section is only for enhancement of understanding of the background, and therefore it may contain information that does not form the prior art that is already known in this country to a person of ordinary skill in the art.

SUMMARY

The display device may include a color conversion panel including color conversion layers and transmission layers. It may be advantageous in the process when the color conversion layers and the transmission layers are formed by an inkjet printing method. When resolution of the display device increases, planar sizes of the color conversion layers and the transmission layers are reduced, so it may be difficult to form the color conversion layers and the transmission layers according to the inkjet printing method.

Embodiments provide a display device for generating color conversion layers and transmission layers by an inkjet printing method in a high-resolution and high-pixel-density display device.

A display device according to an embodiment may include a pixel disposed in a first pixel area, the pixel including a first color pixel, a second color pixel, and a third color pixel for displaying different colors; and a first color conversion region, a second color conversion region, and a third color conversion region respectively overlapping the first color pixel, the second color pixel, and the third color pixel and spaced from each other. The third color conversion region may be aligned with a region between the first color conversion region and the second color conversion region in a first direction, and the first color conversion region and the second color conversion region may be aligned with each other in a second direction crossing the first direction. Part of the first color conversion region may be disposed in a second pixel area that is adjacent to the first pixel area in the second direction, and part of the second color conversion region may be disposed in a third pixel area that is adjacent to the first pixel area in the second direction.

Each of the first pixel area, the second pixel area, and the third pixel area may be a quadrangular shape, the first pixel area may abut the second pixel area, and the first pixel area may abut the third pixel area.

Each of the first color conversion region and the second color conversion region may have a first width in the first direction and a second width in the second direction, and a length of the part of the first color conversion region disposed in the second pixel area in the second direction may be about 15% to about 30% of the first width. A length of the part of the second color conversion region disposed in the third pixel area in the second direction may be about 15% to about 30% of the first width.

A first distance between the first color conversion region and the second color conversion region may be equal to a second distance between the second color conversion region and the third color conversion region and a third distance between the third color conversion region and the first color conversion region.

A third color pixel in the second pixel area and a third color pixel in the third pixel area are aligned with the first color pixel and the second color pixel in the first pixel area in the second direction, and a first color pixel and a second color pixel in the second pixel area and a first color pixel and a second color pixel in the third color pixel area are aligned with the third color pixel in the first pixel area in the second direction.

The first color pixel, the second color pixel, and the third color pixel may be a red pixel, a green pixel, and a blue pixel, respectively.

The display device may include a substrate; a first color conversion layer disposed on the substrate in the first color conversion region; a second color conversion layer disposed on the substrate in the second color conversion region; and a transmission layer disposed on the substrate in the third color conversion region.

The first color conversion layer and the second color conversion layer may include quantum dots.

The display device may further include a bank disposed on the substrate. The first color conversion layer, the second color conversion layer, and the transmission layer may be disposed in regions defined by the bank.

The display device may further include a first color filter disposed between the substrate and the first color conversion layer; a second color filter disposed between the substrate and the second color conversion layer; and a third color filter disposed between the substrate and the transmission layer. Each of the first color filter, the second color filter, and the third color filter may include a portion overlapping the bank.

A display device according to an embodiment includes: first color pixels, second color pixels, and third color pixels for displaying different colors; first color conversion regions corresponding to the first color pixels; second color conversion regions corresponding to the second color pixels; and third color conversion regions corresponding to the third color pixels. Each of the third color conversion regions may be aligned with a corresponding one of regions between the first color conversion regions and the second color conversion regions in a first direction, and the first color conversion regions, the second color conversion regions, and the third color conversion regions may be alternately and repeatedly arranged in a second direction crossing the first direction.

The display device may further include pixel areas each having a quadrangular shape and consecutively arranged. A pixel including a first color pixel, a second color pixel, and a third color pixel may be disposed in each of the pixel areas. A first color conversion region corresponding to the first color pixel in the pixel may include a portion disposed in a first adjacent pixel area, a second color conversion region corresponding to the second color pixel in the pixel may include a portion disposed in a second pixel area, and a third color conversion region corresponding to the third color pixel in the pixel may not include a portion disposed in an adjacent pixel area.

Each of the first color conversion region and the second color conversion region may have a first width in the first direction and a second width in the second direction. A length of the portion of the first color conversion region disposed in the adjacent pixel area in the second direction may be about 15% to about 30% of the first width. A length of the portion of the second color conversion region disposed in an adjacent pixel area in the second direction may be about 15% to about 30% of the first width.

A first distance between the first color conversion region and the second color conversion region may be equal to a second distance between the second color conversion region and the third color conversion region and a third distance between the third color conversion region and the first color conversion region.

If centers of the first color conversion region, the second color conversion region, and the third color conversion region in the unit pixel are connected to each other, a triangle having one side in parallel to the second direction and two sides inclined with respect to the first direction and the second direction may be formed.

The first color pixels may be red pixels, the second color pixels may be green pixels, and the third color pixels may be blue pixels.

The display device may include a substrate; first color conversion layers disposed on the substrate in the first color conversion regions; second color conversion layers disposed on the substrate in the second color conversion regions; and transmission layers disposed on the substrate in the third color conversion regions.

The first color conversion layers and the second color conversion layers may include quantum dots.

The display device may further include a bank disposed on the substrate. The first color conversion layers, the second color conversion layers, and the transmission layers may be disposed in regions defined by the bank.

The display device may further include: first color filters disposed between the substrate and the first color conversion layers; second color filters disposed between the substrate and the second color conversion layers; and third color filters disposed between the substrate and the transmission layers. Each of the first color filters, the second color filters, and the third color filters may include portions overlapping the bank.

According to the embodiments, the high-resolution display device (e.g., resolution of equal to or greater than 6 K, and pixel density of equal to or greater than about 200 ppi) for forming color conversion layers and transmission layers by an inkjet printing method may be provided. Therefore, the manufacturing cost of the display device may be reduced, and the process for manufacturing a display device may be simplified. Further, according to the embodiments, there are advantageous effects that may be recognizable throughout the specification.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
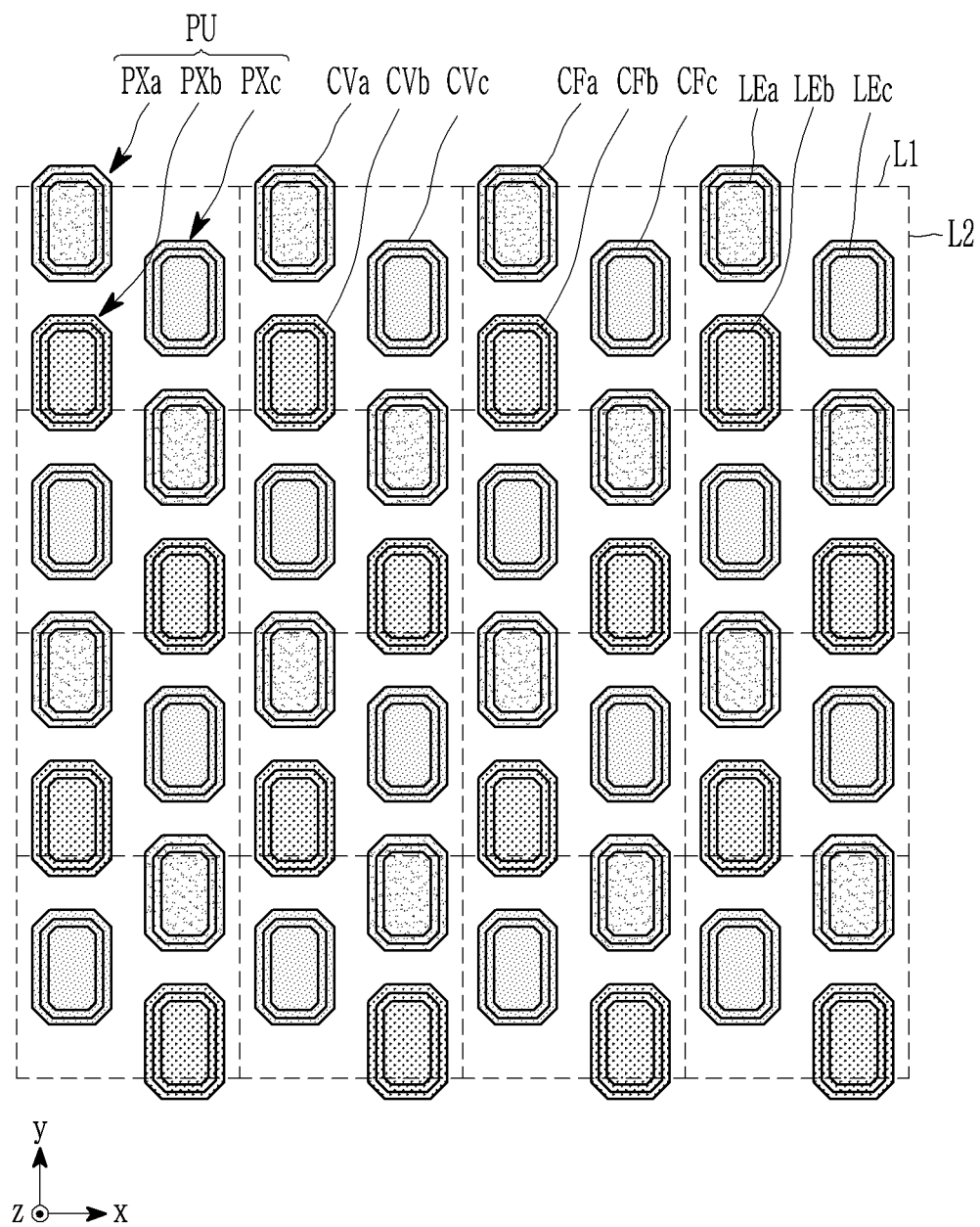
FIG. 1 shows a schematic plan view of a disposal of pixels in a display device according to an embodiment.

In the following detailed description, only some embodiments of the disclosure have been shown and described, simply by way of illustration.

The size and thickness of each component shown in the drawings are arbitrarily shown for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the specification, unless explicitly described to the contrary, the word "comprise," "include," and "have" and variations thereof such as "comprises" or "comprising" will be understood to imply the inclusion of stated elements, but not the exclusion of any other elements.

When it is described that a part is "connected (in contact with, coupled)" to another part, the part may be "directly connected" to the other element, may be "connected" to the other part through a third part, or may be connected to the other part physically or electrically, and they may be referred to by different titles depending on positions or functions, but respective portions that are substantially integrated into one body may be connected to each other.

Terms "x," "y," and "z" are used, and here, "x" is a first direction, "y" is a second direction that is perpendicular to the first direction, and "z" is a third direction that is perpendicular to the first direction and the second direction. The first direction x, the second direction y, and the third direction z may correspond to a horizontal direction, a vertical direction, and a thickness direction of the display device.

Unless specifically described in the specification, "overlap" signifies overlapping in a plan view, and signifies overlapping in the third direction z.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
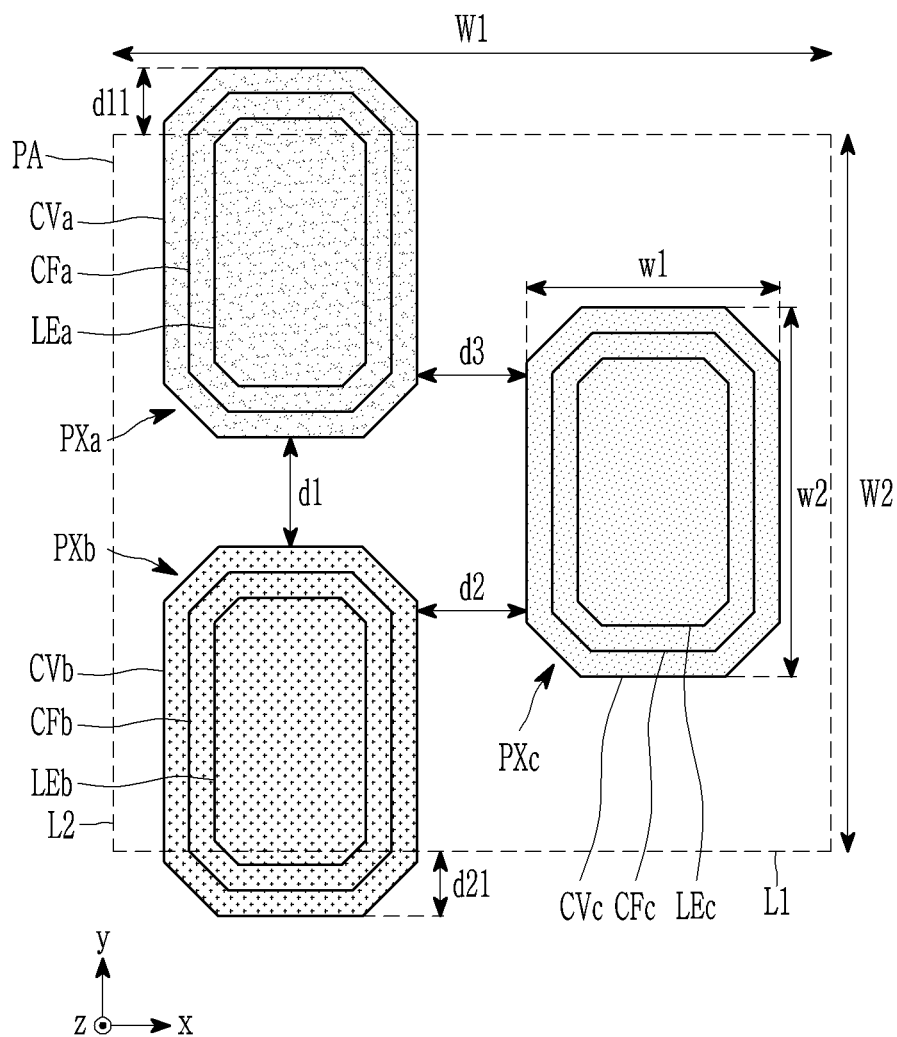
FIG. 2 shows a schematic plan view of a disposal of a pixel area and a unit pixel in a display device shown in FIG. 1.

FIG. 1 illustrates a schematic plan view of a disposal of pixels in a display device according to an embodiment, and FIG. 2 illustrates a schematic plan view of a disposal of a pixel area and a unit pixel in a display device shown in FIG. 1.

Referring to FIGS. 1 and 2, the display device may include first pixels PXa, second pixels PXb, and third pixels PXc. The first pixel PXa, the second pixel PXb, and the third pixel PXc may be minimum units for expressing (or displaying) brightness and darkness. The first pixel PXa, the second pixel PXb, and the third pixel PXc may display different colors and may display one of primary colors. For example, the first pixel PXa may display red, the second pixel PXb may display green, and the third pixel PXc may display blue.

The first pixels PXa, the second pixels PXb, and the third pixels PXc may be disposed to be uniformly distributed. As shown above, the first pixels PXa, the second pixels PXb, and the third pixels PXc may be arranged in a second direction y or may be disposed alternately and repeatedly in the second direction y. The first pixels PXa, the second pixels PXb, and the third pixels PXc may be alternately disposed in the first direction x. For example, the third pixels PXc may be arranged or aligned with regions between the first pixels PXa and the second pixels PXb in the first direction x. The first pixel PXa and the second pixel PXb may be positioned not to be parallel to a side of a third pixel PXc in the first direction x.

Respective quadrangular regions defined by first dotted lines L1 extending in the first direction x and second dotted lines L2 extending in the second direction y may correspond to a pixel area PA. The pixel area PA may be a rectangle with a first width W1 in the first direction and a second width W2 in the second direction. As pixel density becomes higher, the pixel area PA may be reduced.

For example, in case that the pixel density is about 210 ppi, the first width W1 and the second width W2 of the pixel area PA may each be about 120 µm. In case that the pixel density is about 280 ppi, the first width W1 and the second width W2 of the pixel area PA may each be about 90 µm.

A unit pixel PU may be disposed in each pixel area PA. Therefore, the pixel area PA may correspond to a region in which the unit pixel PU is disposed. The pixel density may signify a number of unit pixels PU per inch. The unit pixel PU may be configured with (or include) a first pixel PXa, a second pixel PXb, and a third pixel PXc. The first pixel PXa, the second pixel PXb, and the third pixel PXc may be disposed in a triangular shape in the pixel area PA. For example, the triangular shape may be formed by connecting centers of the first pixel PXa, the second pixel PXb, and the third pixel PXc configuring the unit pixel PU. A side of the triangular shape may be parallel to the second direction y, and two sides of the triangular shape may be inclined with respect to the first direction x and the second direction y. Three drivers for driving the first pixel PXa, the second pixel PXb, and the third pixel PXc may also be disposed in each pixel area PA.

The first pixel PXa, the second pixel PXb, and the third pixel PXc may each have a first width w1 in the first direction x and a second width w2 in the second direction y. The second width w2 may be greater than the first width w1. For example, in case that the pixel density is about 210 ppi, the first width w1 may be about 46 µm, and the second width w2 may be about 66 µm. In case that the pixel density is about 280 ppi, the first width w1 may be about 31 µm, and the second width w2 may be about 46 µm. The first pixel PXa, the second pixel PXb, and the third pixel PXc may each be a polygon, and as shown in FIGS. 1 and 2, they may be octagons.

The first pixel PXa may be spaced apart from the second pixel PXb by a first distance d1, the second pixel PXb may be spaced apart from the third pixel PXc by a second distance d2, and the third pixel PXc may be spaced apart from the first pixel PXa by a third distance d3. The first distance d1, the second distance d2, and the third distance d3 may be equal to each other. For example, the first distance d1, the second distance d2, and the third distance d3 may each be greater than about 14 µm. At least one of the first distance d1, the second distance d2, and the third distance d3 may be different from the others. The above-mentioned descriptions of first distance d1, the second distance d2, and the third distance d3 may be applied to spaces among the first, second, and third pixels PXa, PXb, and PXc positioned in the adjacent pixel areas PA.

The entire third pixel PXc may be positioned in the pixel area PA. Most of the first pixel PXa may be positioned in the pixel area PA, and a portion thereof may be positioned on an outside of the corresponding pixel area PA, for example, on an inside of another pixel area PA that is adjacent thereto in the second direction y. A length d11 of a portion of the first pixel PXa positioned in the adjacent pixel area PA in the second direction y may be about 15% to about 30% of the second width w2, for example, about 20%. Most of the second pixel PXb may be positioned in the pixel area PA, and a portion thereof may be positioned on the outside of the corresponding pixel area PA, for example, on the inside of another pixel area PA that is adjacent thereto in the second direction y. A length d21 of the portion of the second pixel PXb positioned in the adjacent pixel area PA in the second direction y may be about 15% to about 30% of the second width w2, for example, about 20%. The length d11 and the length d21 may be equal to or may be different from each other.

As described above, the unit pixel PU may be positioned in a pixel area PA, and the first pixel PXa and the second pixel PXb may include a portion that is outside the pixel areas PA of the first pixel PXa and the second pixel PXb and positioned in other pixel areas PA that are adjacent thereto in the second direction y.

The display device may include first color conversion regions CVa, first color filter regions CFa, and first light emission regions LEa overlapping the first pixels PXa. The display device may include second color conversion regions CVb, second color filter regions CFb, and second light emission regions LEb overlapping the second pixels PXb. The display device may include third color conversion regions CVc, third color filter regions CFc, and third light emission regions LEc overlapping the third pixels PXc.

Figure 3:
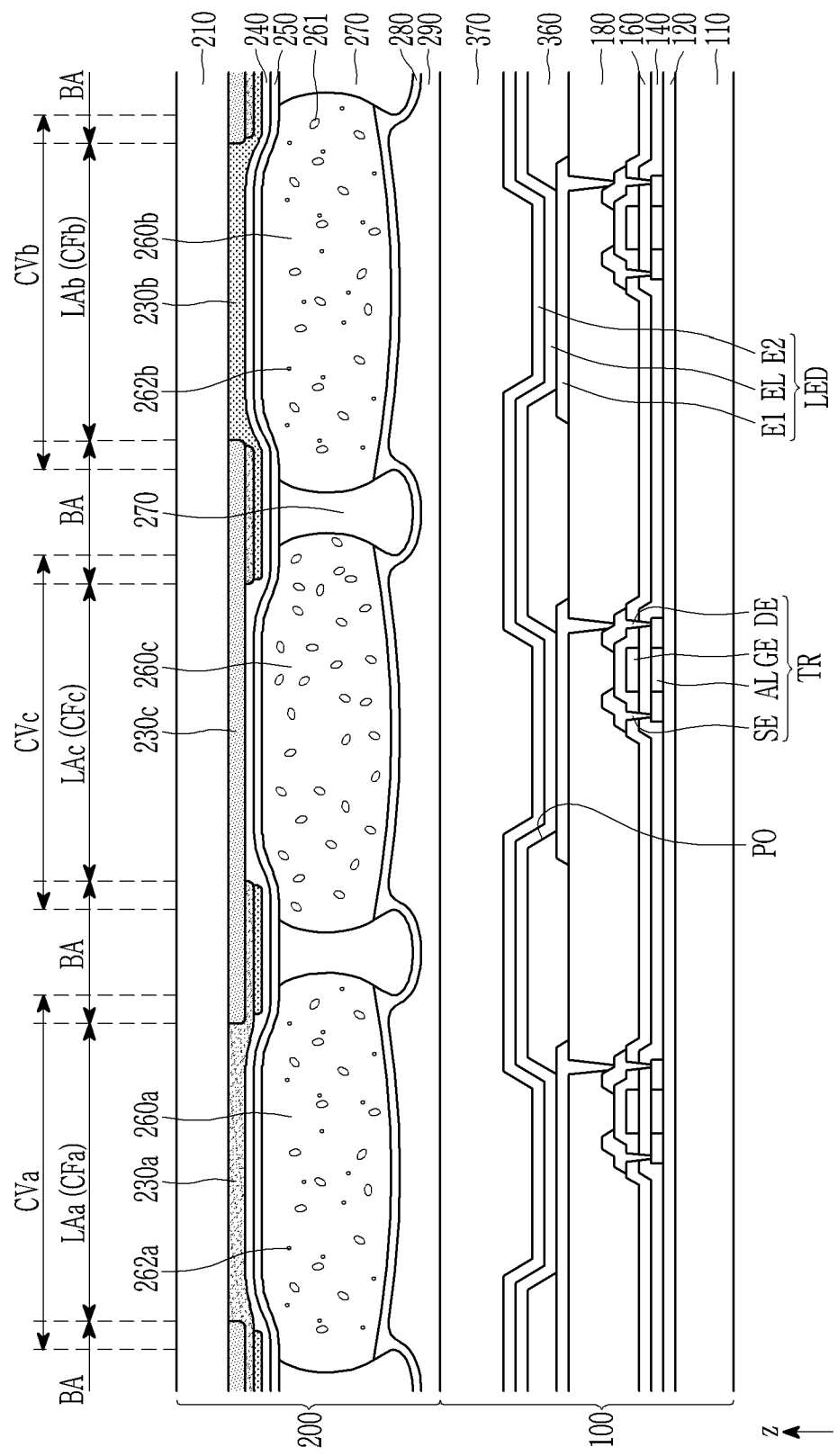
FIG. 3 shows a schematic cross-sectional view of a display device according to an embodiment.

Referring to FIG. 3, the first color conversion region CVa may be a region in which a first color conversion layer 260a is positioned, the second color conversion region CVb may be a region in which a second color conversion layer 260b is positioned, and the third color conversion region CVc may be a region in which a transmission layer 260c is positioned. The first color conversion region CVa, the second color conversion region CVb, and the third color conversion region CVc may be defined by a bank 270.

The first color conversion region CVa, the second color conversion region CVb, and the third color conversion region CVc may substantially correspond to the first pixel PXa, the second pixel PXb, and the third pixel PXc, respectively. Therefore, the above-described content relating to the arrangement and size of the first pixel PXa, the second pixel PXb, and the third pixel PXc may be equivalently applied to the first color conversion region CVa, the second color conversion region CVb, and the third color conversion region CVc.

In detail, the first color conversion regions CVa, the second color conversion regions CVb, and the third color conversion regions CVc may be arranged in the second direction y and may be disposed alternately and repeatedly in the second direction y. The first color conversion regions CVa, the second color conversion regions CVb, and the third color conversion regions CVc may be alternately disposed in the first direction x, and the third color conversion regions CVc may be arranged or aligned with the regions between the first color conversion regions CVa and the second color conversion regions CVb in the first direction x. The first color conversion region CVa and the second color conversion region CVb may be positioned not to be parallel to a side of a third color conversion region CVc in the first direction x.

A first color conversion region CVa, a second color conversion region CVb, and a third color conversion region CVc may be disposed in each pixel area PA. The first color conversion region CVa, the second color conversion region CVb, and the third color conversion region CVc may be disposed in a triangular shape in the pixel area PA, and the triangular shape may be drawn by connecting the centers of the first color conversion region CVa, the second color conversion region CVb, and the third color conversion region CVc. A side of the triangular shape may be parallel to the second direction y, and two sides of the triangular shape may be inclined with respect to the first direction x and the second direction y. The first color conversion region CVa, the second color conversion region CVb, and the third color conversion region CVc may each have a first width w1 in the first direction x and a second width w2 in the second direction y.

The entire third color conversion region CVc may be positioned in the pixel area PA. Most of the first color conversion region CVa may be positioned in the pixel area PA, and a portion thereof may be positioned outside the corresponding pixel area PA, for example, inside another pixel area PA that is adjacent thereto in the second direction y. A length d11 of a portion of the first color conversion region CVa positioned in the adjacent pixel area PA in the second direction y may be about 15% to about 30% of the second width w2, for example, about 20%. Most of the second color conversion region CVb may be positioned in the pixel area PA, and a portion thereof may be positioned outside the corresponding pixel area PA, for example, inside another pixel area PA that is adjacent thereto in the second direction y. A length d21 of a portion of the second color conversion region CVb positioned in the adjacent pixel area PA in the second direction y may be about 15% to about 30% of the second width w2, for example, about 20%.

As described, although the unit pixel PU is positioned in a pixel area PA, the first color conversion region CVa and the second color conversion region CVb may include portions that are outside the pixel areas PA of the first color conversion region CVa and the second color conversion region CVb and positioned in other pixel areas PA that are adjacent thereto in the second direction y. According to this, in the implementation of high-resolution display devices, the distances d1, d2, and d3 among the first, second, and third color conversion regions CVa, CVb, and CVc may be set to be equal to or greater than a predetermined value (e.g., about 14 µm), and the first width w1 and the second width w2 of each of the first, second, and third color conversion regions CVa, CVb, and CVc may be obtained to be equal to or greater than a predetermined value (e.g., about 30 µm), and as described below, first and second color conversion layers 260a and 260b and a transmission layers 260c of a color conversion panel 200 may be formed by an inkjet printing process.

The first color filter region CFa, the second color filter region CFb, and the third color filter region CFc may respectively be regions for emitting first color light, second color light, and third color light in the display device. The first color filter region CFa, the second color filter region CFb, and the third color filter region CFc may be respectively positioned in the first color conversion region CVa, the second color conversion region CVb, and the third color conversion region CVc. The first color filter region CFa, the second color filter region CFb, and the third color filter region CFc may respectively have a shape substantially corresponding to the first color conversion region CVa, the second color conversion region CVb, and the third color conversion region CVc in a plan view and/or may have other shapes.

The first light emission region LEa, the second light emission region LEb, and the third light emission region LEc may respectively be a light emission region of a light emitting diode LED corresponding to the first pixel PXa, the second pixel PXb, and the third pixel PXc. The first light emission region LEa, the second light emission region LEb, and the third light emission region LEc may be respectively positioned in the first color filter region CFa, the second color filter region CFb, and the third color filter region CFc. The first light emission region LEa, the second light emission region LEb, and the third light emission region LEc may respectively have a shape substantially corresponding to the first color filter region CFa, the second color filter region CFb, and the third color filter region CFc in a plan view and/or may also have other shapes.

A cross-sectional structure of a display device for forming a first pixel PXa, a second pixel PXb, and a third pixel PXc will now be described with reference to FIG. 3.

FIG. 3 illustrates a schematic cross-sectional view of a display device according to an embodiment. A region shown in FIG. 3 may correspond to a pixel area PA.

The display device may include a first color conversion region CVa, a second color conversion region CVb, and a third color conversion region CVc. The first color conversion region CVa, the second color conversion region CVb, and the third color conversion region CVc may respectively correspond to the above-described first pixel PXa, the second pixel PXb, and the third pixel PXc. The display device may include a first color light output area LAa, a second color light output area LAb, and a third color light output area LAc. A blocking area BA may be positioned between the first color light output area LAa and the second color light output area LAb, between the second color light output area LAb and the third color light output area LAc, and between the third color light output area LAc and the first color light output area LAa. The first color light output area LAa, the second color light output area LAb, and the third color light output area LAc may respectively correspond to the first color filter region CFa, the second color filter region CFb, and the third color filter region CFc.

The display device may include a display panel 100 and a color conversion panel 200. The first, second, and third color conversion regions CVa, CVb, and CVc, the first, second, and third color light output areas LAa, Lab, and LAc, the first, second, and third color filter regions CFa, CFb, and CFc, and the blocking area BA may generally be defined by the color conversion panel 200.

The display panel 100 may include a first substrate 110, a transistor TR positioned on the first substrate 110, and a light emitting diode LED electrically connected to the transistor TR.

The first substrate 110 may be a glass substrate. The first substrate 110 may be a flexible substrate including polymers such as a polyimide, a polyamide, or a polyethylene terephthalate.

A buffer layer 120 may be positioned on the first substrate 110. The buffer layer 120 may improve characteristics of a semiconductor layer AL by blocking an impurity from the first substrate 110 when the semiconductor layer AL is formed and may ease a stress on the semiconductor layer AL by planarizing a surface of the first substrate 110. The buffer layer 120 may include an inorganic insulating material such as a silicon oxide, a silicon nitride, or a silicon oxynitride. The buffer layer 120 may include amorphous silicon.

A barrier layer (not shown) for preventing permeation of moisture or oxygen may be positioned between the first substrate 110 and the buffer layer 120.

A semiconductor layer AL of a transistor TR may be positioned on the buffer layer 120. The semiconductor layer AL may include a first region, a second region, and a channel region between the first and second regions. The semiconductor layer AL may include polysilicon or an oxide semiconductor. In case that the semiconductor layer AL includes the oxide semiconductor, the semiconductor layer AL may include at least one of zinc (Zn), indium (In), gallium (Ga), and tin (Sn). For example, the semiconductor layer AL may include an indium gallium zinc oxide (IGZO).

A gate insulating layer 140 may be positioned on the semiconductor layer AL. The gate insulating layer 140 may include an inorganic insulating material such as a silicon nitride ($SiN_x$), a silicon oxide ($SiO_x$), or a silicon oxynitride ($SiO_xN_y$) and may be a single layer or a multi-layer.

A gate electrode GE of the transistor TR may be positioned on the gate insulating layer 140, and the gate electrode GE may include molybdenum (Mo), aluminum (Al), copper (Cu), and titanium (Ti) and may be a single layer or a multi-layer.

An inter-layer insulating layer 160 may be positioned on the gate electrode GE. The inter-layer insulating layer 160 may include an inorganic insulating material such as a silicon nitride, a silicon oxide, or a silicon oxynitride and may be a single layer or a multi-layer. In case that the inter-layer insulating layer 160 is a multi-layer, a lower layer may include a silicon nitride, and an upper layer may include a silicon oxide.

A first electrode SE and a second electrode DE of the transistor TR may be positioned on the inter-layer insulating layer 160. The first electrode SE and the second electrode DE may be electrically connected to the first region and the second region of the semiconductor layer AL through contact holes formed in the inter-layer insulating layer 160, respectively. One of the first electrode SE and the second electrode DE may be a source electrode, and the other may be a drain electrode. The first electrode SE and the second electrode DE may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and copper (Cu), and may be a single layer or a multi-layer. For example, a first data conductive layer may include a lower layer including a refractory metal such as molybdenum, chromium, tantalum, or titanium, a middle layer including a metal with low resistivity such as aluminum, copper, or silver, and an upper layer including a refractory metal.

A planarization layer 180 may be positioned on the first electrode SE and the second electrode DE. The planarization layer 180 may be an organic insulating layer. For example, the planarization layer 180 may include an organic insulating material including a general-purpose polymer such as polymethyl methacrylate or polystyrene, a polymer derivative having a phenol-based group, an acryl-based polymer, an imide-based polymer, a polyimide, and a siloxane-based polymer.

A pixel electrode E1 may be positioned on the planarization layer 180. The pixel electrode E1 may be electrically connected to the second electrode DE through a contact hole formed in the planarization layer 180, and it may receive a data voltage for controlling luminance of the light emitting diode LED. The pixel electrode E1 may be individually provided for each pixel. The pixel electrode E1 may include a metal such as silver (Ag), lithium (Li), calcium (Ca), aluminum (Al), magnesium (Mg), or gold (Au). The pixel electrode E1 may include a transparent conductive oxide (TCO) such as an indium tin oxide (ITO) or an indium zinc oxide (IZO).

A pixel defining layer 360 may be positioned on the pixel electrode E1. The pixel defining layer 360 may overlap the pixel electrode E1 and may include a pixel opening PO for defining a light emission region of the light emitting diode LED. The pixel defining layer 360 may include an organic insulating material including a general-purpose polymer such as polymethyl methacrylate or polystyrene, a polymer derivative having a phenol-based group, an acryl-based polymer, an imide-based polymer, a polyimide, and a siloxane-based polymer. The pixel defining layer 360 may be a black pixel defining layer 360 including a black dye or a pigment. The black pixel defining layer 360 may improve a contrast ratio and may prevent a reflection by a metal layer positioned below. The pixel opening PO and the pixel electrode E1 may have a similar shape in a plan view. The pixel opening PO may correspond to the above-described first, second, and third light emission regions LEa, LEb, and LEc.

An emission layer (or light emission layer) EL may be positioned on the pixel electrode E1. At least a portion of the emission layer EL may be positioned in the pixel opening PO. The emission layer EL may also be positioned on the pixel defining layer 360. At least one of a hole injection layer, a hole transport layer, an electron transport layer, and an electron injection layer in addition to the emission layer EL may be positioned on the pixel electrode E1.

A common electrode E2 may be positioned on the emission layer EL. The common electrode E2 may be provided in common to pixels. The common electrode E2 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), or lithium (Li). The common electrode E2 may include a transparent conductive oxide (TCO) such as an indium tin oxide (ITO) or an indium zinc oxide (IZO).

The pixel electrode E1, the emission layer EL, and the common electrode E2 may configure (or form) a light emitting diode LED. The pixel electrode E1 may be an anode of the light emitting diode LED, and the common electrode E2 may be a cathode of the light emitting diode LED. The light emitting diode LED may output light with a first wavelength.

An encapsulation layer 370 may be positioned on the common electrode E2. The encapsulation layer 370 may encapsulate the light emitting diode LED to prevent permeation of moisture and oxygen from the outside. The encapsulation layer 370 may be a thin film encapsulation layer including at least one inorganic layer and at least one organic layer.

A color conversion panel 200 may be positioned on the encapsulation layer 370.

The color conversion panel 200 may include a second substrate 210 facing the first substrate 110 of the display panel 100. The second substrate 210 may be a glass substrate. The second substrate 210 may be a flexible substrate including polymers such as a polyimide, a polyamide, and a polyethylene terephthalate.

A first color filter 230a, a second color filter 230b, and a third color filter 230c may be positioned on the second substrate 210 facing the display panel 100, for example, in a direction −z. The first color filter 230a may transmit the first color light having passed through the first color conversion layer 260a, may absorb light with other wavelengths, and may increase purity of the first color light output to the outside of the display device. The second color filter 230b may transmit the second color light having passed through the second color conversion layer 260b, may absorb the light with other wavelengths, and may increase purity of the second color light output to the outside of the display device. The third color filter 230c may transmit the third color light having passed through the transmission layer 260c, may absorb light with other wavelengths, and may increase purity of the third color light output to the outside of the display device. The first color filter 230a, the second color filter 230b, and the third color filter 230c may be respectively positioned in the first color filter region CFa, the second color filter region CFb, and the third color filter region CFc. The first color filter 230a, the second color filter 230b, and the third color filter 230c may be positioned in the blocking area BA, and the first color filter 230a, the second color filter 230b, and the third color filter 230c may be combined with each other and be used as a light blocking member.

A low refractive index layer 240 may be positioned on the first color filter 230a, the second color filter 230b, and the third color filter 230c. The low refractive index layer 240 may be positioned in the first color light output area LAa, the second color light output area LAb, and the third color light output area LAc. The low refractive index layer 240 may also be positioned in the blocking area BA.

The low refractive index layer 240 may have a lower refractive index than the first color conversion layer 260a, the second color conversion layer 260b, and the transmission layer 260c. For example, the low refractive index layer 240 may have a refractive index of about 1.1 to about 1.3. For example, in case that an incident angle of light output to the low refractive index layer 240 from the first color conversion layer 260a is greater than a threshold angle, the light may be totally reflected to the first color conversion layer 260a and may be used as incident light of the first color conversion layer 260a. Accordingly, light output efficiency may be increased, and mixture of light output by adjacent pixels may be prevented. The low refractive index layer 240 may include an organic material and/or an inorganic material satisfying a predetermined refractive index.

A first capping layer 250 may be positioned on the low refractive index layer 240. The first capping layer 250 may prevent components of the first color filter 230a, the second color filter 230b, the third color filter 230c, and the low refractive index layer 240 from being spread to the outside.

A bank 270 overlapping boundaries of the first color light output area LAa, the second color light output area LAb, and the third color light output area LAc may be positioned on the capping layer 250. The bank 270 may overlap the blocking area BA. The bank 270 may define a region in which the first color conversion layer 260a, the second color conversion layer 260b, and the transmission layer 260c are positioned. Therefore, the bank 270 may define the first, second, and third color conversion regions CVa, CVb, and CVc.

The first color conversion layer 260a, the second color conversion layer 260b, and the transmission layer 260c may be positioned in the region defined by the bank 270. In a plan view, they may correspond to the first color conversion region CVa of the first color conversion layer 260a, the second color conversion region CVb of the second color conversion layer 260b, and the third color conversion region CVc of the transmission layer 260c, respectively. The first color conversion layer 260a, the second color conversion layer 260b, and the transmission layer 260c may be formed by the inkjet printing process.

The transmission layer 260c may transmit light with a first wavelength input from the display panel 100. The transmission layer 260c may include scatterers 261. Light of the first wavelength may be blue light with a range of the maximum emitting peak wavelength of about 380 nm to about 480 nm, for example, equal to or greater than about 420 nm, equal to or greater than about 430 nm, equal to or greater than about 440 nm, or equal to or greater than about 445 nm, and equal to or less than about 470 nm, equal to or less than about 460 nm, or equal to or less than about 455 nm.

The first color conversion layer 260a may convert light of a first wavelength input from the display panel 100 into red light. The first color conversion layer 260a may include scatterers 261 and first quantum dots 262a. A range of the maximum emitting peak wavelength of the red light may be about 600 nm to about 650 nm, for example, about 620 nm to about 650 nm.

The second color conversion layer 260b may convert the light with a first wavelength input from the display panel 100 into green light. The second color conversion layer 260b may include scatterers 261 and second quantum dots 262b. A range of the maximum emitting peak wavelength of green light may be about 500 nm to about 550 nm, for example, about 510 nm to about 550 nm.

The scatterers 261 may scatter the light input to the first color conversion layer 260a, the second color conversion layer 260b, and the transmission layer 260c to increase efficiency of light.

The respective first quantum dot 262a and the second quantum dot 262b (hereinafter, the quantum dot will also be referred to as semiconductor nanocrystal) may independently include a group II-VI compound, a group III-V compound, a group IV-VI compound, a group IV element or compound, a group I-III-VI compound, a group II-III-VI compound, a group I-II-IV-VI compound, or a combination thereof.

The group II-VI compound may be selected from among a binary compound selected from among CdSe, CdTe, ZnS, ZnSe, ZnTe, ZnO, HgS, HgSe, HgTe, MgSe, MgS, and a mixture thereof; a tertiary compound selected from among AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The group II-VI compound may further include a group III metal.

The group III-V compound may be selected from among a binary compound selected from among GaN, GaP, GaAs, GaSb, AlN, AlP, AlAs, AlSb, InN, InP, InAs, InSb, and a mixture thereof; a tertiary compound selected from among GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a quaternary compound selected from among GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The group III-V compound may further include a group II metal (e.g., InZnP).

The group IV-VI compound may be selected from among a binary compound selected from among SnS, SnSe, SnTe, PbS, PbSe, PbTe, and a mixture thereof; a tertiary compound selected from among SnSeS, SnSeTe, SnSTe, PbSeS, PbSeTe, PbSTe, SnPbS, SnPbSe, SnPbTe, and a mixture thereof; and a quaternary compound selected from among SnPbSSe, SnPbSeTe, SnPbSTe, and a mixture thereof.

The group IV element or compound may be selected from among a unary compound selected from among Si, Ge, and a combination thereof; and a binary compound selected from among SiC, SiGe, and a combination thereof.

The group I-III-VI compound may be selected from among $CuInSe_2$, $CuInS_2$, CuInGaSe, and CuInGaS.

The group IV element or compound may be selected from among a unary compound selected from among Si, Ge, and a mixture thereof; and a binary compound selected from among SiC, SiGe, and a mixture thereof.

The group II-III-VI compound may be selected from among ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof, and is not limited thereto.

The group I-II-IV-VI compound may be selected from among CuZnSnSe and CuZnSnS.

The quantum dot may not include cadmium. The quantum dot may include a semiconductor nanocrystal based on the group III-V compound including indium and phosphorus. The group III-V compound may further include zinc. The quantum dot may include a semiconductor nanocrystal based on the group II-VI compound including a chalcogen (e.g., sulfur, selenium, tellurium, or a combination thereof) and zinc.

Regarding the quantum dot, the above-described binary compound, the tertiary compound, and/or the quaternary compound may be present in the particles with a uniform concentration or may be present in the same particles having different parts of different concentration distributions. Further, the color conversion layers may have a core-shell structure where a quantum dot surrounds another quantum dot. An interface between the core and the shell may have a concentration gradient such that a concentration of an element present in the shell is gradually reduced toward the center thereof.

In some embodiments, the quantum dot may have a core-shell structure including a core including the above-described nanocrystal and a shell surrounding the core. The shell of the quantum dot may function as a protective layer for maintaining the semiconductor characteristic by preventing chemical denaturation of the core and/or a charging layer for providing an electrophoretic characteristic to the quantum dot. The shell may be a single layer or a multi-layer. An interface between the core and the shell may have a concentration gradient such that a concentration of an element present in the shell is gradually reduced toward the center thereof. Examples of the shell of the quantum dot may include a metallic or non-metallic oxide, a semiconductor compound, or a combination thereof.

The metallic or non-metallic oxide may be, for example, binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, COO, $Co_3O_4$, Or NiO, or tertiary compounds such as $MgAl_2O_4$, $CoFe_2O_4$, $NiFe_2O_4$, or $CoMn_2O_4$.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

The quantum dot may have a full width at half maximum (FWHM) of a light-emitting wavelength spectrum that is equal to or less than about 45 nm, equal to or less than about 40 nm, or equal to or less than about 30 nm, and it may improve color purity or color reproducibility within this range. Further, light emitted through the quantum dot may be output in all directions, thereby improving a viewing angle.

Regarding the quantum dot, a shell material and a core material may have different energy bandgaps. For example, the energy bandgap of the shell material may be greater or less than the energy bandgap of the core material. The quantum dot may have a multi-layered shell. Regarding the multi-layered shell, the energy bandgap of an outer layer may be greater than the energy bandgap of an inner layer (for example, a layer that is near the core). Regarding the multi-layered shell, the energy bandgap of the outer layer may be less than the energy bandgap of the inner layer.

A shape of the quantum dot is not specifically limited. For example, the shape of the quantum dot may include a sphere, a polyhedron, a pyramid, a multipod, a square, a cuboid, a nanotube, a nanorod, a nanowire, a nanosheet, or a combination thereof.

The quantum dot may include an organic ligand (e.g., having a hydrophobic residue and/or a hydrophilic residue). The organic ligand residue may be combined with the surface of the quantum dot. The organic ligand may include RCOOH, $RNH_2$, $R_2NH$, $R_3N$, RSH, $R_3PO$, $R_3P$, ROH, RCOOR, $RPO(OH)_2$, RHPOOH, RHPOOH, or a combination thereof. Here, R may be independently a C3 to C40 substituted or unsubstituted aliphatic hydrocarbon group such as a C3 to C40 (e.g., C5 to C24) substituted or unsubstituted alkyl group, or substituted or unsubstituted alkenyl group, a C6 to C40 (e.g., C6 to C20) substituted or unsubstituted aromatic hydrocarbon group such as a C6 to C40 substituted or unsubstituted aryl group, or a combination thereof.

Examples of the organic ligand may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octyl phosphine, dioctyl phosphine, tributyl phosphine, or trioctyl phosphine, phosphine compounds or their oxide compounds such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, trioctyl phosphine oxide; diphenyl phosphine, a triphenyl phosphine compound, or oxide compounds thereof; C5 to C20 alkylphosphinic acids such as hexylphosphinic acid, octylphosphinic acid, dodecanephosphinic acid, tetradecanephosphinic acid, hexadecanephosphinic acid, or octadecanephosphinic acid; and C5 to C20 alkyl phosphonic acids. The quantum dot may include the hydrophobic organic ligand alone or as a mixture of at least one kind. The hydrophobic organic ligand may not include a photopolymerizable residue (e.g., acrylate or methacrylate).

The quantum dot may control the output color of light according to the size of particles, and thus, the quantum dot may have various light-emitting colors such as blue, red, and green.

A second capping layer 280 may be positioned on the first color conversion layer 260a, the second color conversion layer 260b, and the transmission layer 260c. The second capping layer 280 may prevent the component of a packed layer 290 injected when the color conversion panel 200 is attached to the display panel 100 from being input to the first color conversion layer 260a, the second color conversion layer 260b, and the transmission layer 260c by covering or overlapping the first color conversion layer 260a, the second color conversion layer 260b, and the transmission layer 260c.

A packed layer 290 may be positioned on the second capping layer 280. The packed layer 290 may attach the display panel 100 to the color conversion panel 200.

An example of a method for manufacturing a color conversion panel 200 of a display device will now be described with reference to FIGS. 4 to 7.

FIGS. 4 to 7 illustrate schematic cross-sectional views of a method for manufacturing a color conversion panel according to an embodiment.

Figure 4:
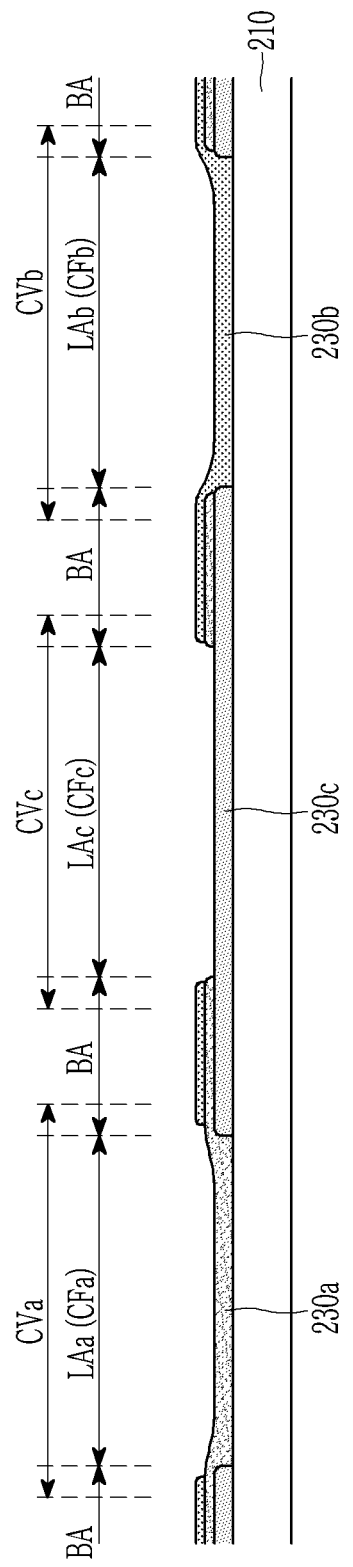
FIG. 4, FIG. 5, FIG. 6, and FIG. 7 show schematic cross-sectional views of a method for manufacturing a color conversion panel according to an embodiment.

Referring to FIG. 4, a first color filter 230a, a second color filter 230b, and a third color filter 230c may be positioned on the second substrate 210. As shown in FIG. 4, the third color filter 230c, the first color filter 230a, and the second color filter 230b may be sequentially positioned and may be provided in another order. The first color filter 230a, the second color filter 230b, and the third color filter 230c may be formed by a photolithography process.

The first color filter 230a may be positioned in the first color light output area LAa and the blocking area BA. The second color filter 230b may be positioned in the second color light output area LAb and the blocking area BA. The third color filter 230c may be positioned in the third color light output area LAc and the blocking area BA. The first color filter 230a, the second color filter 230b, and the third color filter 230c may be positioned in the blocking area BA.

A full wavelength region of visible light may not transmit the color conversion panel 200 by a combination of the first color filter 230a, the second color filter 230b, and the third color filter 230c, and thus the first color filter 230a, the second color filter 230b, and the third color filter 230c may become light blocking members in the blocking area BA.

Figure 5:
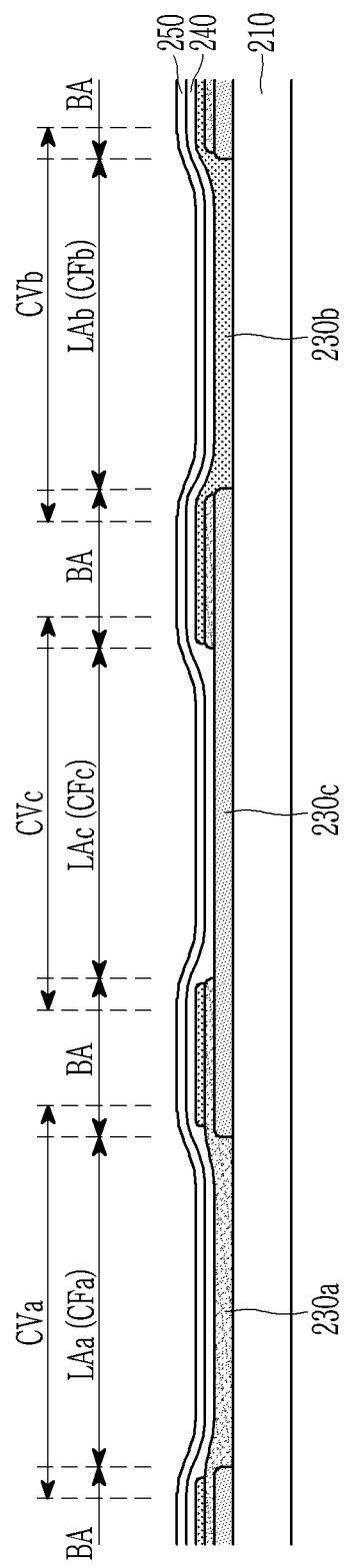

Referring to FIG. 5, a low refractive index layer 240 may be positioned on the first color filter 230a, the second color filter 230b, and the third color filter 230c, and a first capping layer 250 may be positioned on the low refractive index layer 240. The low refractive index layer 240 and the first capping layer 250 may be positioned on the entire second substrate 210.

Figure 6:
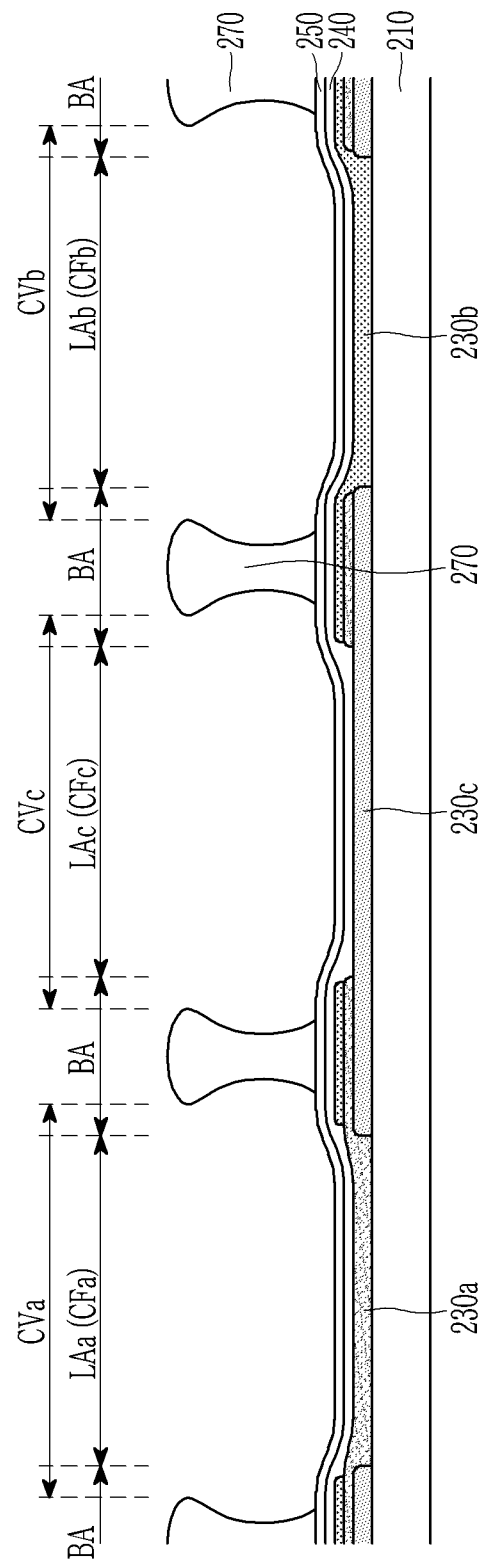

Referring to FIG. 6, a bank 270 may be positioned on the first capping layer 250. The bank 270 may be positioned on the boundaries of the first color light output area LAa, the second color light output area LAb, and the third color light output area LAc. The bank 270 may define a first color conversion region CVa, a second color conversion region CVb, and a third color conversion region CVc. The spaces defined by the bank 270 may receive the first color conversion layer 260a, the second color conversion layer 260b, and the transmission layer 260c.

Figure 7:
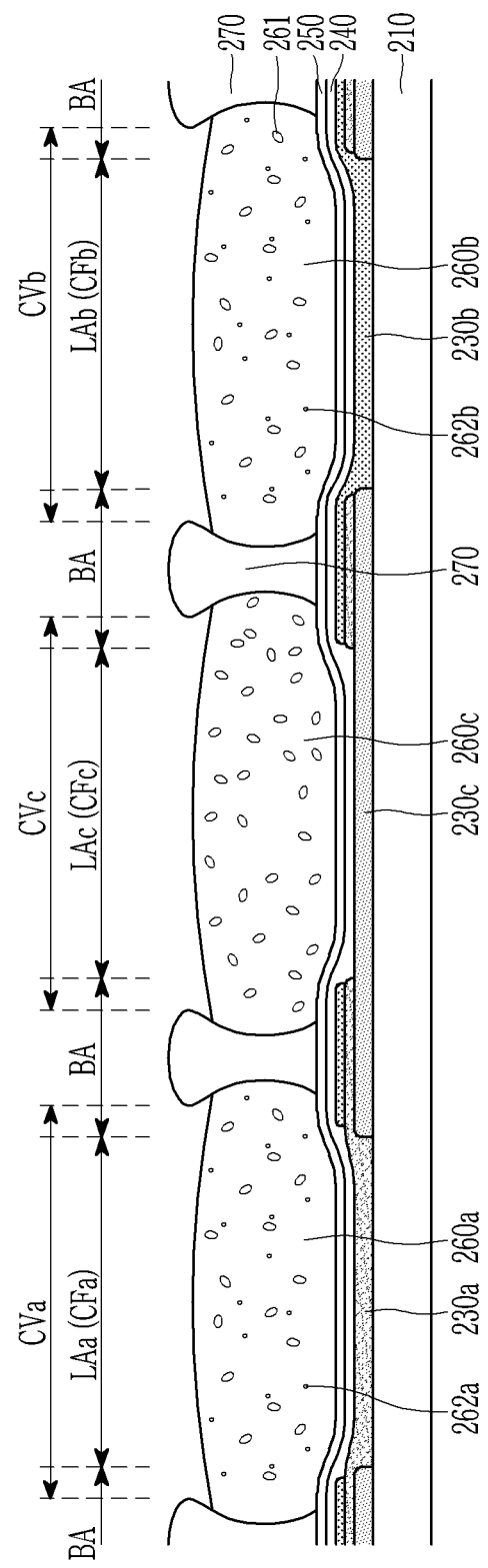

Referring to FIG. 7, among the spaces defined by the bank 270, the first color conversion layer 260a may be positioned in the first color light output area LAa, the second color conversion layer 260b may be positioned in the second color light output area LAb, and the transmission layer 260c may be positioned in the third color light output area LAc. The first color conversion layer 260a, the second color conversion layer 260b, and the transmission layer 260c may be formed by the inkjet printing process. A second capping layer 280 for covering or overlapping the first color conversion layer 260a, the second color conversion layer 260b, and the transmission layer 260c may be provided as shown in FIG. 3.

Unlike the photolithography process for forming a layer to cover or overlap the entire substrate and partially removing the layer to form a pattern, the inkjet printing process may form the pattern by printing, so it may reduce the amount of material for forming the pattern. Further, the inkjet printing process may not be required to use a mask, thereby reducing the number of processes and the cost.

Referring to FIGS. 1 and 2, the width of the bank 270 among the first, second, and third color conversion regions CVa, CVb, and CVc may correspond to the distances d1, d2, and d3 among the first, second, and third color conversion regions CVa, CVb, and CVc. For the formation and structural stability of the bank 270, the bank 270 may be formed to have a width that is equal to or greater than a predetermined value (e.g., about 14 μm). In case that the size (e.g., a volume of about 7 pl (picoliter) or a diameter of about 10 μm) of droplets discharged through an inkjet nozzle and shelling precision (e.g., about ±10 μm) are considered, the first, second, and third color conversion regions CVa, CVb, and CVc may need to have a width of equal to or greater than a predetermined value (e.g., about 30 μm) so as to accurately print the material for forming the first and second color conversion layers 260a and 260b and the transmission layer 260c in the first, second, and third color conversion regions CVa, CVb, and CVc. However, in case that a display device of the high-resolution (e.g., a pixel density of equal to or greater than about 200 ppi) is manufactured, it may be difficult in the conventional pixel disposal to set the width of the bank 270 to be equal to or greater than a threshold value and set the widths of the first, second, and third color conversion regions CVa, CVb, and CVc to be equal to or greater than a threshold value. According to the pixel disposal according to an embodiment described with reference to FIGS. 1 and 2, the width of the bank 270 and the widths of the first, second, and third color conversion regions CVa, CVb, and CVc may be set to be equal to or greater than a threshold value, so the first color conversion layer 260a, the second color conversion layer 260b, and the transmission layer 260c may be formed by the inkjet printing process.

FIGS. 8 to 11 illustrate a schematic plan view of a disposal of a pixel area and a unit pixel in a display device according to an embodiment.

The first pixel PXa, the second pixel PXb, and the third pixel PXc may have various shapes in addition to the octagonal planar shape described with reference to FIGS. 1 and 2.

Figure 8:
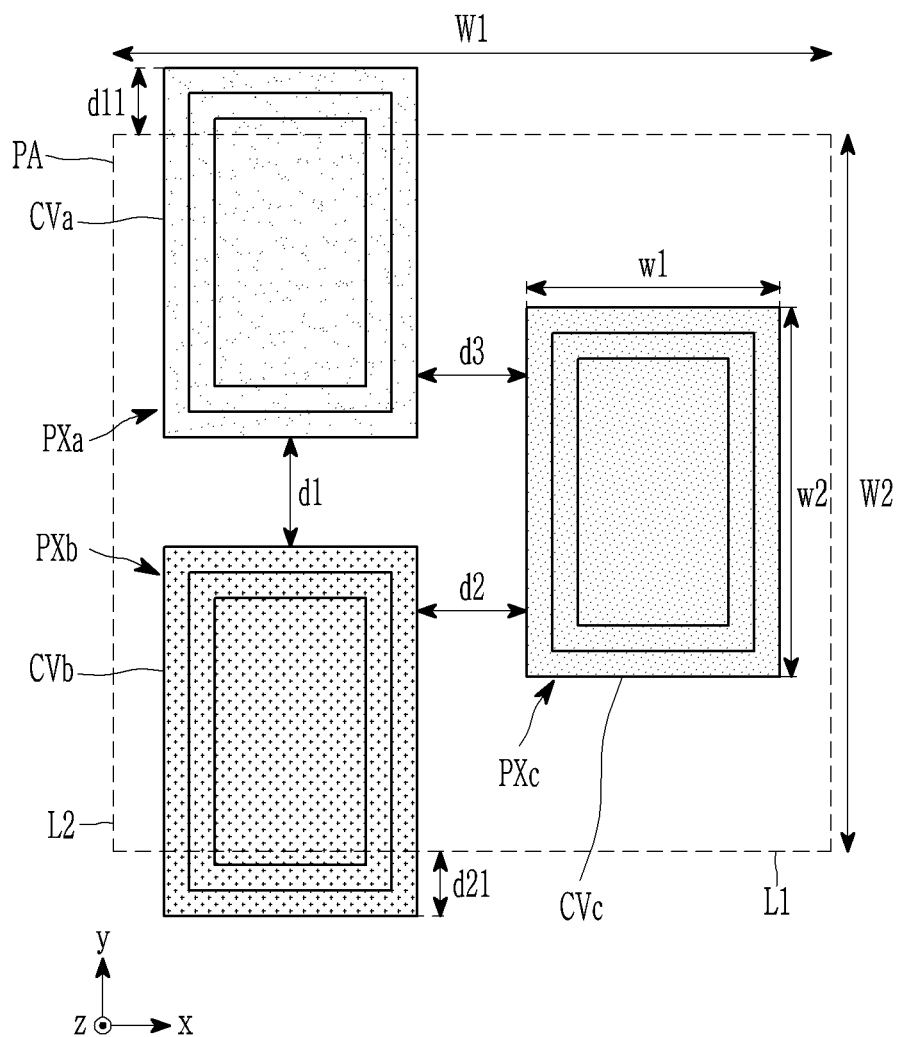
FIG. 8, FIG. 9, FIG. 10 and FIG. 11 show a schematic plan view of a disposal of a pixel area and a unit pixel in a display device according to an embodiment.

Referring to FIG. 8, the first pixel PXa, the second pixel PXb, and the third pixel PXc, and the corresponding first color conversion region CVa, the second color conversion region CVb, and the third color conversion region CVc, may have a quadrangular planar shape. In case that the first color conversion region CVa, the second color conversion region CVb, and the third color conversion region CVc have planar shapes, the first color conversion region CVa and the second color conversion region CVb may include portions outside the pixel areas PA of the first color conversion region CVa and the second color conversion region CVb and positioned in other pixel areas PA that are adjacent thereto in the second direction y. While the distances d1, d2, and d3 among the first, second, and third color conversion regions CVa, CVb, and CVc are set to be equal to or greater than a predetermined value, the first width w1 and the second width w2 of the first, second, and third color conversion regions CVa, CVb, and CVc may be obtained to be equal to or greater than a predetermined value for the inkjet printing process.

Figure 9:
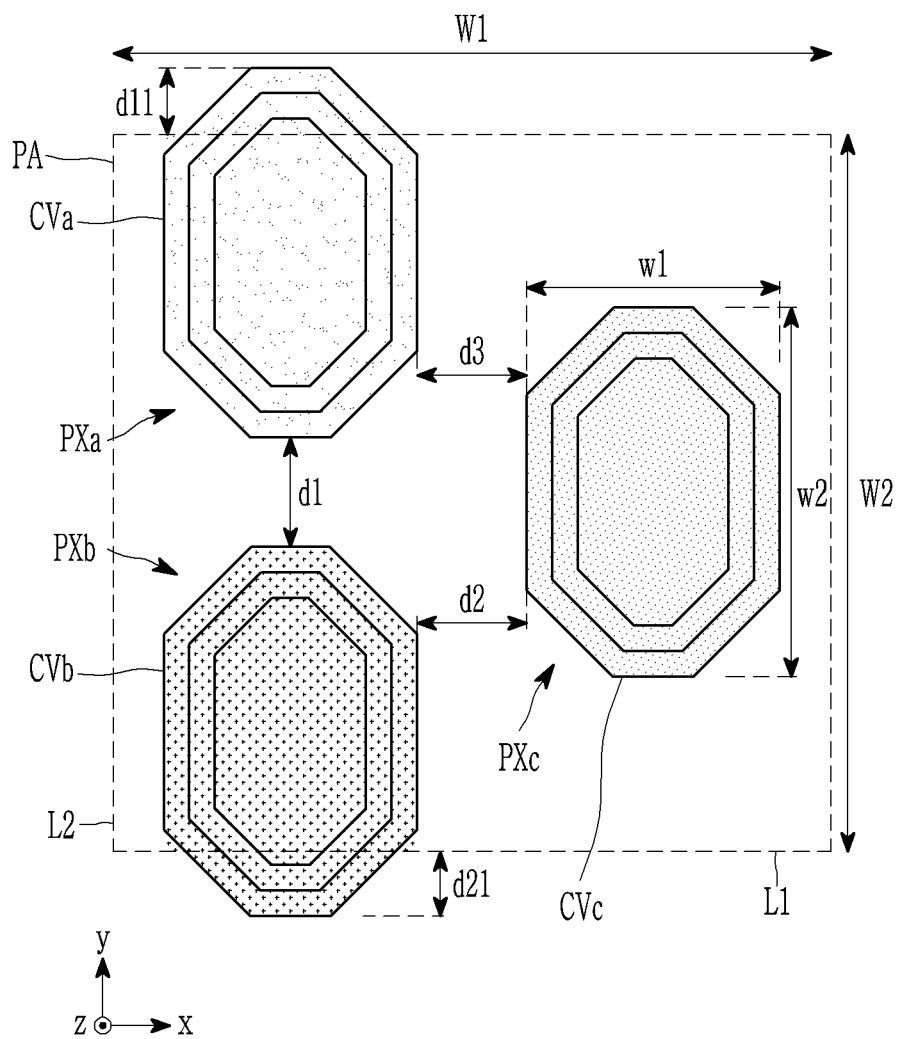
Figure 10:
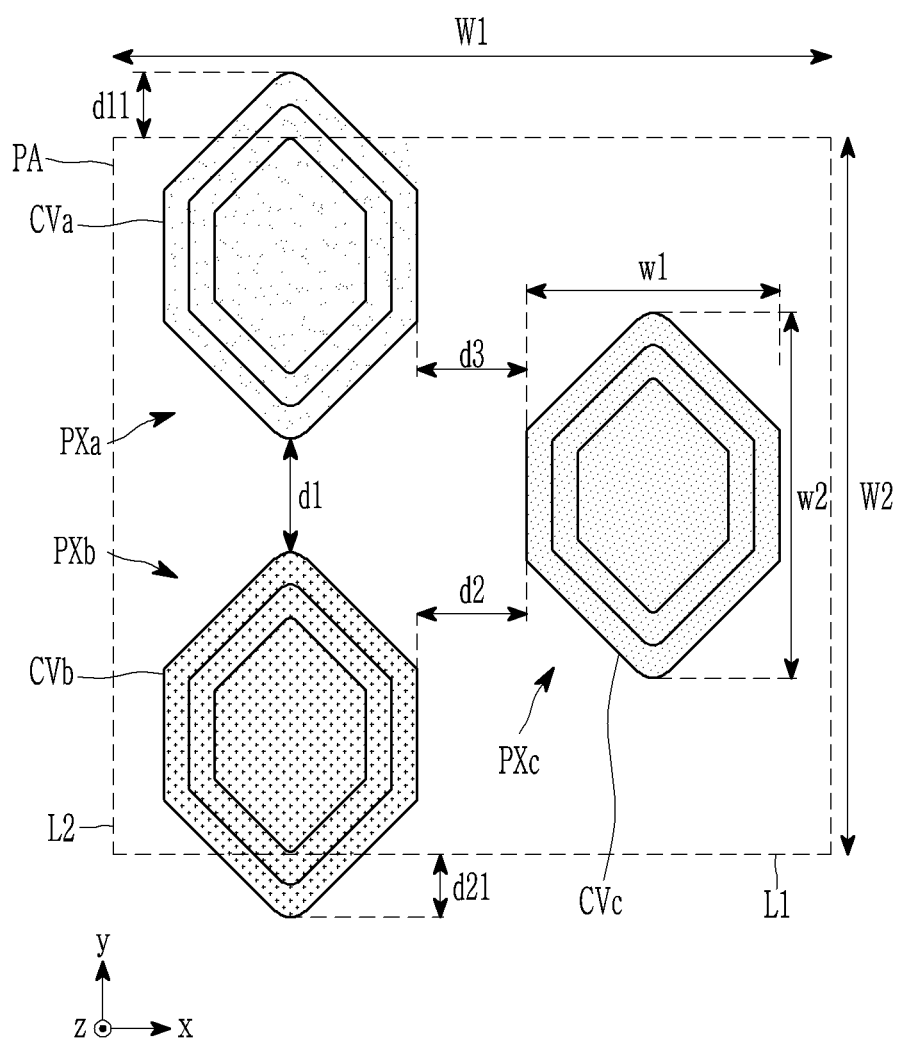
Figure 11:
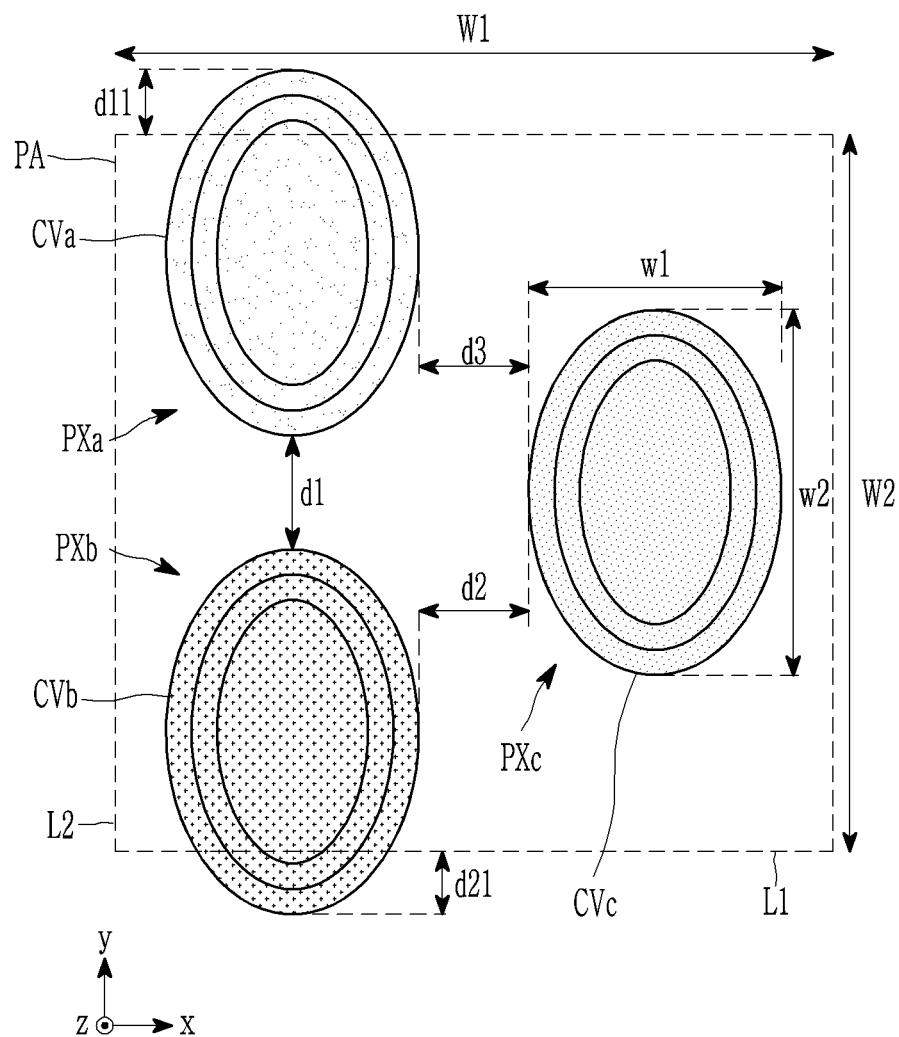

Referring to FIG. 9, the first pixel PXa, the second pixel PXb, and the third pixel PXc may have an octagonal planar shape. They may be octagonal as the first, second, and third pixels PXa, PXb, and PXc described with reference to FIGS. 1 and 2, but are further sharper in the second direction y. Referring to FIG. 10, the first pixel PXa, the second pixel PXb, and the third pixel PXc may have a hexagonal planar shape. Referring to FIG. 11, the first pixel PXa, the second pixel PXb, and the third pixel PXc may have an oval planar shape. The first, second, and third pixels PXa, PXb, and PXc according to embodiments described with reference to FIGS. 9 to 11 may have smaller areas than the first, second, and third pixels PXa, PXb, and PXc according to an embodiment with reference to FIGS. 1 and 2, and areas of the first, second, and third color conversion regions CVa, CVb, and CVc and the first, second, and third color filter regions CFa, CFb, and CFc may be reduced. However, the area of the bank 270 may increase as much as areas of the first, second, and third color conversion regions CVa, CVb, and CVc are reduced, and thus the area of the bank 270 attached to the lower layer (e.g., the first capping layer 250) may increase and it may be advantageous to prevent the bank 270 from being pulled out. Further, in case that a spacer is positioned on the color conversion panel 200, an area in which the spacer may be disposed may be increased.

In case that areas of the first, second, and third color conversion regions CVa, CVb, and CVc are reduced, portions of the first color conversion region CVa and the second color conversion region CVb may be positioned in other pixel areas PA that are adjacent to the pixel area PA in the second direction y, and thus the first width w1 and the second width w2 of the first, second, and third color conversion regions CVa, CVb, and CVc may be obtained to be equal to or greater than predetermined values. Therefore, the first color conversion layer 260a, the second color conversion layer 260b, and the transmission layer 260c may be formed by the inkjet printing process.

While the disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
a pixel disposed in a first pixel area, the pixel including a first color pixel, a second color pixel, and a third color pixel for displaying different colors; and
a first color conversion region, a second color conversion region, and a third color conversion region respectively overlapping the first color pixel, the second color pixel, and the third color pixel and spaced from each other, wherein
the third color conversion region is aligned with a region between the first color conversion region and the second color conversion region in a first direction,
the first color conversion region and the second color conversion region are aligned with each other in a second direction crossing the first direction,
part of the first color conversion region is disposed in a second pixel area that is adjacent to the first pixel area in the second direction, and
part of the second color conversion region is disposed in a third pixel area that is adjacent to the first pixel area in the second direction, wherein
the first color conversion region and the second color conversion region in the first pixel area overlap each other in the second direction and not in the first direction;
the third color conversion region in the first pixel area overlaps, in the first direction and not in the second direction, at least a portion of the first color conversion region in the first pixel area and at least a portion of the second color conversion region in the first pixel area.

2. The display device of claim 1, wherein
each of the first pixel area, the second pixel area, and the third pixel area is a quadrangular shape,
the first pixel area abuts the second pixel area, and
the first pixel area abuts the third pixel area.

3. The display device of claim 1, wherein
each of the first color conversion region and the second color conversion region has a first width in the first direction and a second width in the second direction,
a length of the part of the first color conversion region disposed in the second pixel area in the second direction is about 15% to about 30% of the first width, and
a length of the part of the second color conversion region disposed in the third pixel area in the second direction is about 15% to about 30% of the first width.

4. The display device of claim 1, wherein a first distance between the first color conversion region and the second color conversion region is equal to a second distance between the second color conversion region and the third color conversion region and a third distance between the third color conversion region and the first color conversion region.

5. The display device of claim 1, wherein a third color pixel in the second pixel area and a third color pixel in the third pixel area are aligned with the first color pixel and the second color pixel in the first pixel area in the second direction, and
a first color pixel and a second color pixel in the second pixel area and a first color pixel and a second color pixel in the third color pixel area are aligned with the third color pixel in the first pixel area in the second direction.

6. The display device of claim 1, wherein the first color pixel, the second color pixel, and the third color pixel are a red pixel, a green pixel, and a blue pixel, respectively.

7. The display device of claim 1, comprising:
a substrate;
a first color conversion layer disposed on the substrate in the first color conversion region;
a second color conversion layer disposed on the substrate in the second color conversion region; and
a transmission layer disposed on the substrate in the third color conversion region.

8. The display device of claim 7, wherein the first color conversion layer and the second color conversion layer include quantum dots.

9. The display device of claim 7, further comprising a bank disposed on the substrate,
wherein the first color conversion layer, the second color conversion layer, and the transmission layer are disposed in regions defined by the bank.

10. The display device of claim 9, further comprising:
a first color filter disposed between the substrate and the first color conversion layer;
a second color filter disposed between the substrate and the second color conversion layer; and
a third color filter disposed between the substrate and the transmission layer,
wherein each of the first color filter, the second color filter, and the third color filter includes a portion overlapping the bank.

11. A display device comprising:
first color pixels, second color pixels, and third color pixels for displaying different colors;
first color conversion regions corresponding to the first color pixels;
second color conversion regions corresponding to the second color pixels; and
third color conversion regions corresponding to the third color pixels, wherein
each of the third color conversion regions are aligned with a corresponding one of regions between the first color conversion regions and the second color conversion regions in a first direction, and
the first color conversion regions, the second color conversion regions, and the third color conversion regions are alternately and repeatedly arranged in a second direction crossing the first direction, wherein
the first color conversion region and the second color conversion region in the first pixel area overlap each other in the second direction and not in the first direction;
the third color conversion region in the first pixel area overlaps, in the first direction and not in the second direction, at least a portion of the first color conversion region in the first pixel area and at least a portion of the second color conversion region in the first pixel area.

12. The display device of claim 11, further comprising:
pixel areas each having a quadrangular shape and consecutively arranged, wherein
a pixel including a first color pixel, a second color pixel, and a third color pixel is disposed in each of the pixel areas, a first color conversion region corresponding to the first color pixel in the pixel includes a portion disposed in a first adjacent pixel area,
a second color conversion region corresponding to the second color pixel in the pixel includes a portion disposed in a second adjacent pixel area, and
a third color conversion region corresponding to the third color pixel in the pixel does not include a portion disposed in an adjacent pixel area.

13. The display device of claim 12, wherein
each of the first color conversion region and the second color conversion region has a first width in the first direction and a second width in the second direction,
a length of the portion of the first color conversion region disposed in the adjacent pixel area in the second direction is about 15% to about 30% of the first width, and
a length of the portion of the second color conversion region disposed in the adjacent pixel area in the second direction is about 15% to about 30% of the first width.

14. The display device of claim 12, wherein a first distance between the first color conversion region and the second color conversion region is equal to a second distance between the second color conversion region and the third color conversion region and a third distance between the third color conversion region and the first color conversion region.

15. The display device of claim 12, wherein if centers of the first color conversion region, the second color conversion region, and the third color conversion region in the pixel are connected to each other, a triangle having one side in parallel to the second direction and two sides inclined with respect to the first direction and the second direction is formed.

16. The display device of claim 11, wherein
the first color pixels are red pixels,
the second color pixels are green pixels, and
the third color pixels are blue pixels.

17. The display device of claim 11, comprising:
a substrate;
first color conversion layers disposed on the substrate in the first color conversion regions;
second color conversion layers disposed on the substrate in the second color conversion regions; and
transmission layers disposed on the substrate in the third color conversion regions.

18. The display device of claim 17, wherein the first color conversion layers and the second color conversion layers include quantum dots.

19. The display device of claim 17, further comprising:
a bank disposed on the substrate,
wherein the first color conversion layers, the second color conversion layers, and the transmission layers are disposed in regions defined by the bank.

20. The display device of claim 19, further comprising:
first color filters disposed between the substrate and the first color conversion layers;
second color filters disposed between the substrate and the second color conversion layers; and
third color filters disposed between the substrate and the transmission layers,
wherein each of the first color filters, the second color filters, and the third color filters include portions overlapping the bank.

* * * * *